US 6,607,991 B1

(12) United States Patent
Livesay et al.

(10) Patent No.: US 6,607,991 B1
(45) Date of Patent: Aug. 19, 2003

(54) METHOD FOR CURING SPIN-ON DIELECTRIC FILMS UTILIZING ELECTRON BEAM RADIATION

(75) Inventors: William R. Livesay, San Diego, CA (US); Matthew F. Ross, La Jolla, CA (US); Anthony L. Rubiales, Poway, CA (US); Heike Thompson, San Diego, CA (US); Selmer Wong, San Diego, CA (US); Trey Marlowe, La Jolla, CA (US); Mark Narcy, Escondido, CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/474,399

(22) Filed: Dec. 29, 1999

Related U.S. Application Data

(63) Continuation-in-part of application No. 08/856,888, filed on May 14, 1997, now Pat. No. 6,132,814, which is a continuation of application No. 08/437,461, filed on May 8, 1995, now abandoned.

(51) Int. Cl.[7] .............................................. H01L 21/469
(52) U.S. Cl. ..................... 438/787; 438/473; 438/638
(58) Field of Search ................................ 438/787, 780, 438/781, 622, 638, 473; 427/542; 250/492.3, 492.2, 492.23

(56) References Cited

U.S. PATENT DOCUMENTS

| 4,041,190 A | 8/1977 | Dubois et al. |
| 4,222,792 A | 9/1980 | Lever et al. |
| 4,596,720 A | 6/1986 | Keryk et al. |
| 4,600,685 A | 7/1986 | Kitakohji et al. |
| 4,983,546 A | 1/1991 | Hyun et al. |

(List continued on next page.)

FOREIGN PATENT DOCUMENTS

| WO | WO 96/36070 | 11/1996 |
| WO | WO 97/00535 | 1/1997 |
| WO | WO 98/43294 | 10/1998 |

OTHER PUBLICATIONS

Moriya, et al., "Large increase of refractive index and compactness in siloxane–type spin–on glass induced by ion implantation", Appl. Phys. Lett. 57(2), pp. 108–110, Jul. 9, 1990.

Molzen, et al., "Materials and techniques used in nanostructure fabrication", J. Vac. Sci. Technol., 16(2), pp. 269–272, Mar./Apr. 1979.

(List continued on next page.)

*Primary Examiner*—Wael Fahmy
*Assistant Examiner*—(Vikki) Hoa B. Trinh
(74) *Attorney, Agent, or Firm*—Roberts & Mercanti, LLP

(57) ABSTRACT

An electron beam exposure method is described which provides a means of curing spin-on-glass or spin-on-polymer dielectric material formed on a semiconductor wafer. The dielectric material insulates the conductive metal layer and planarizes the topography in the process of manufacturing multilayered integrated circuits. The method utilizes a large area, uniform electron beam exposure system in a soft vacuum environment. A wafer coated with uncured dielectric material is irradiated with electrons of sufficient energy to penetrate the entire thickness of the dielectric material and is simultaneously heated by infrared heaters. By adjusting the process conditions, such as electron beam total dose and energy, temperature of the wafer, and ambient atmosphere, the properties of the cured dielectric material can be modified.

16 Claims, 3 Drawing Sheets

U.S. PATENT DOCUMENTS

| | | | |
|---|---|---|---|
| 5,003,178 A | 3/1991 | Livesay | 250/492.3 |
| 5,024,969 A | 6/1991 | Reche | |
| 5,119,164 A | 6/1992 | Sliwa, Jr. et al. | |
| 5,192,697 A | 3/1993 | Leong | |
| 5,192,715 A | 3/1993 | Sliwa, Jr. et al. | |
| 5,376,586 A | 12/1994 | Beilin et al. | |
| 5,468,595 A | 11/1995 | Livesay | |
| 5,609,925 A * | 3/1997 | Camilletti et al. | 427/503 |
| 5,989,983 A | 11/1999 | Goo et al. | 438/473 |
| 6,132,814 A * | 10/2000 | Livesay et al. | 427/542 |
| 6,255,232 B1 * | 7/2001 | Chang et al. | 438/780 |

OTHER PUBLICATIONS

Elovikov et al., "Controlled Formation Of Thin Polymer Films By Electron Irradiation", Thin Solid Films, vol. 62, pp. 303–316, 1979.

Christy, "Formation of Thin Polymer Films by Electron Bombardment", Journal of Applied Physics, vol. 31, No. 9, pp. 1680–1683, Sep. 1960.

Moriya, et al., "Modification of Effects in Ion–Implanted SiO2 Spin–On–Glass", J. Electrochem. Soc., vol. 140, No. 5, p. 1442, May 1993.

Koh, et al., "Direct Patterning of Spin–on Glass by Focused Ion Beam Irradiation", J. Appl. Phys., vol. 13, No. 12B, pp. 4479–4482, Dec. 1992.

Imai, et al., "Novel Process for Direct Delineation of Spin on Glass (SOG)", J. Appl. Phys, vol. 29, No. 11, pp. 2653–2656, Nov. 1990.

Chen, et al., "Radiation Effects of E–beam Fabricated Sbmicron NMOS Transistors", IEEE Electron Device Letters, vol. Edl. 3, No. 1, 3 pages, Jan. 1982.

Forester, et al., "Electron–Beam Curing Of Non–Etchback SOG And Application to A $0.5\mu M$ CMOS SRAM Process", VMIC Conference, pp. 83–89, Jun. 27–29, 1995.

Moreau, "Semiconductor Lithography Principles, Practices and Materials", Chapter 9, p. 446, 1988.

Kwon, et al., "Prevention of $O_2$ Plasma Damage On Siloxane SOG By Applying E–Beam Curing", 4 pages.

* cited by examiner

FIG. 3 Film Shrinkage vs. Dose and Temperature
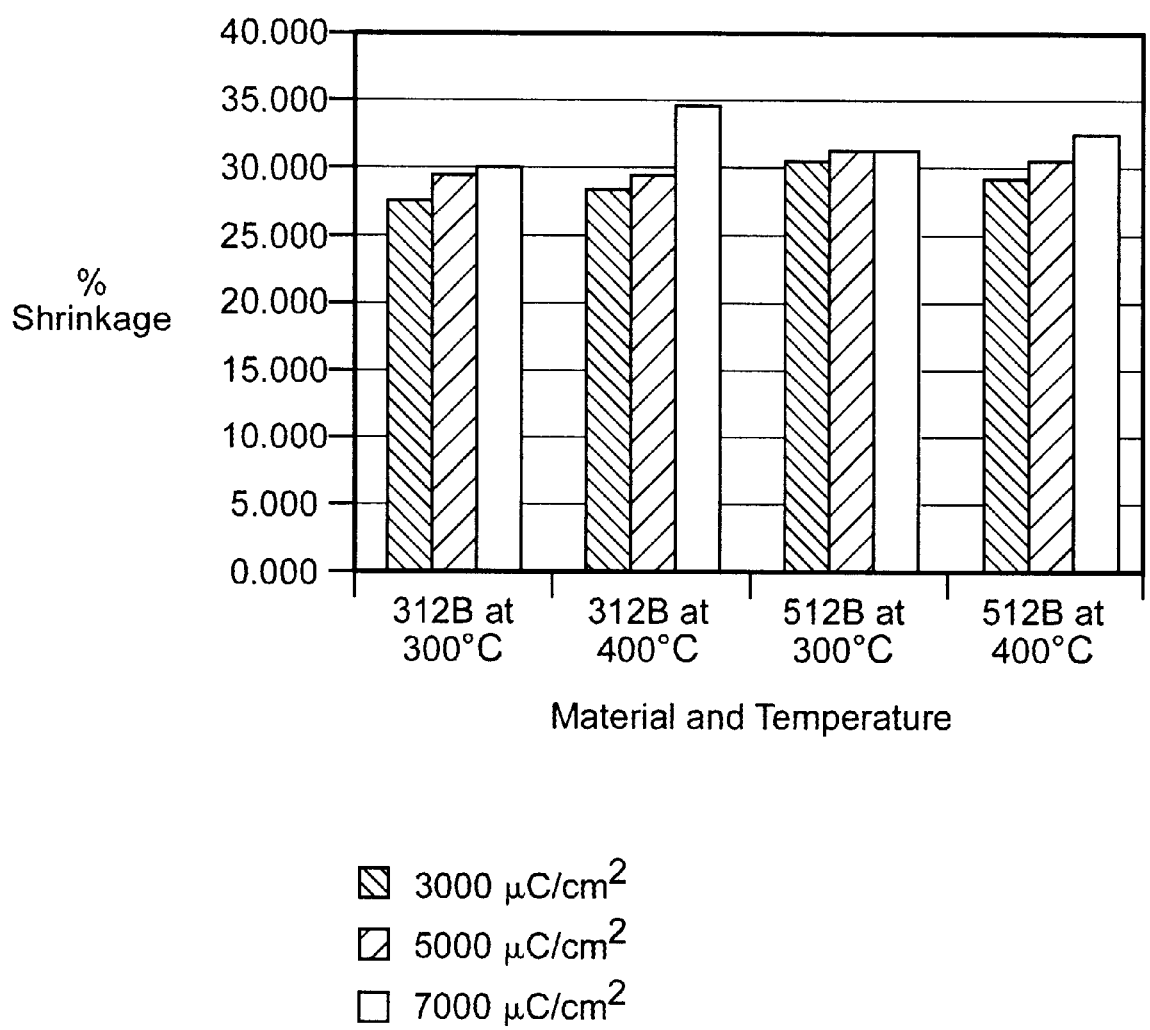

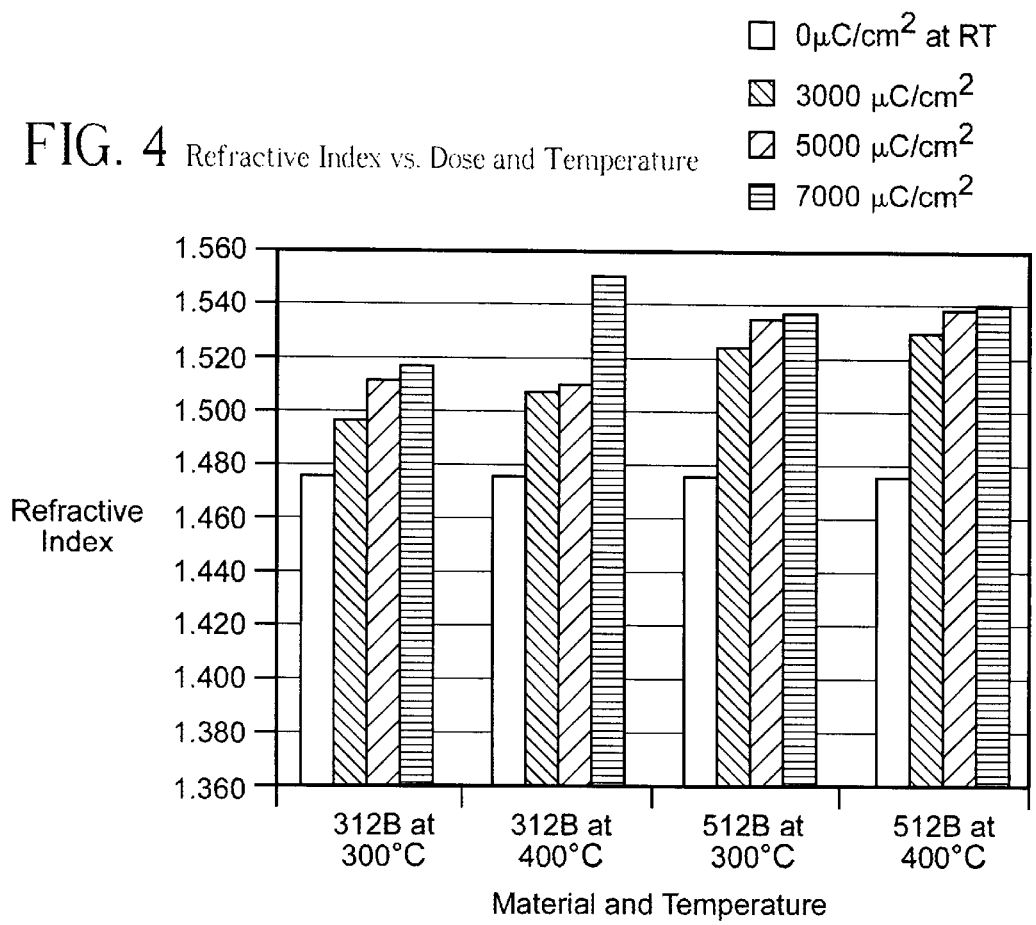
FIG. 4 Refractive Index vs. Dose and Temperature
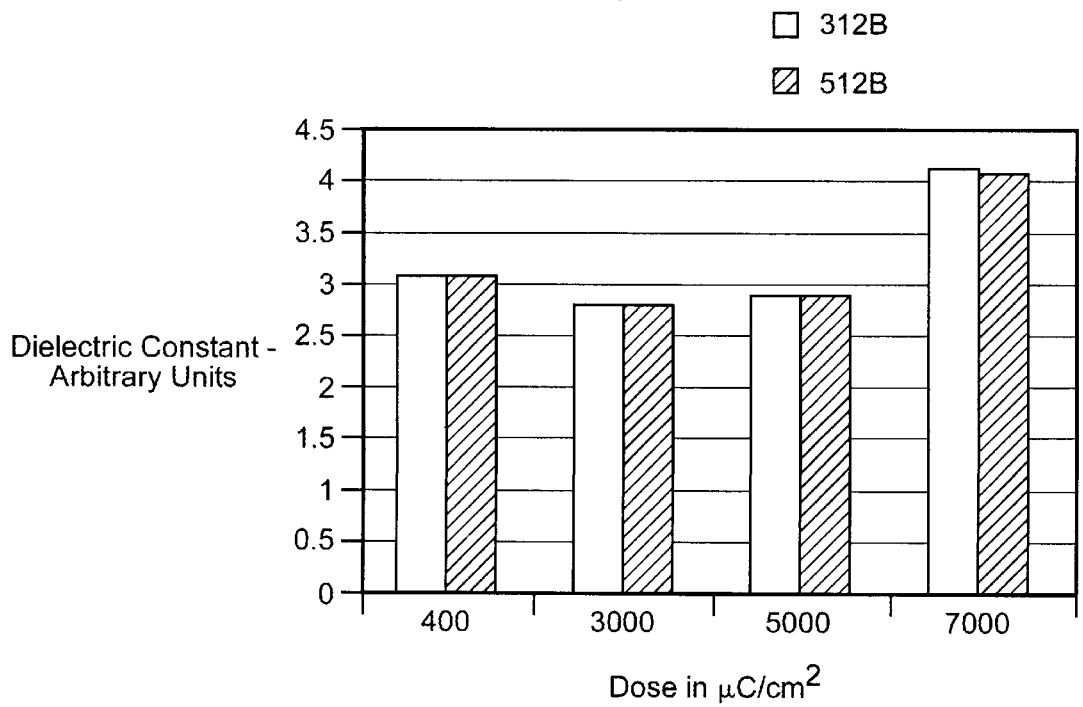
FIG. 5 Dielectric Constant vs. Dose at 300°C

METHOD FOR CURING SPIN-ON DIELECTRIC FILMS UTILIZING ELECTRON BEAM RADIATION

CROSS REFERENCE TO RELATED APPLICATION

This application is a continuation-in-part of U.S. patent application Ser. No. 08/856,888, filed May 14, 1997, now U.S. Pat. No. 6,132,814, which is a continuation of U.S. patent application Ser. No. 08/437,461, filed May 8, 1995, now abandoned.

BACKGROUND OF THE INVENTION

1. Field of the Invention

This invention relates generally to the fabrication of semiconductor devices and, more particularly, to methods for curing spin-on dielectric materials used in semiconductor devices.

2. Description of the Prior Art

Interlayer dielectrics utilized in multilevel interconnection in manufacturing of ultra-large scale integrated circuits have requirements to provide gap filing into high aspect ratio gaps (between metal conductors) and a high flatness of the topology (planarization). To meet these requirements, numerous interlevel dielectric formation processes have been investigated. Tetraethylorthosilicate (TEOS) based chemical vapor deposition (CVD), biased high density plasma CVD combined with chemical mechanical polishing (CMP) have been developed. There are a number of problems with these technologies including: particle generation, process reliability, cost and gap filling capability. Spin-on-glass processes have been utilized and offer simplicity, better gap filling and planarization than these other techniques.

In integrated circuit process technology, the fabrication of reliable interconnect structures with high yields require the deposition of metallization layers of uniform thickness and their subsequent patterning while preserving critical dimensions and line widths. These process goals are difficult to realize unless the substrate is planarized prior to the metallization step. That is, the interlayer dielectric must fill the space between the closely packed vertical wall metal lines of the lower interconnect level so as to produce a smooth topography. Spin-on-glass materials are limited in terms of thickness by their tendency to crack when made in thick layers and cured. Spin-on-glass liquids typically consist of a silicon oxygen network of polymers, one of which is siloxane, dissolved in an organic solvent (typically a combination of a high boiling point solvent and a low boiling point solvent). The dissolved spin-on-glass material is coated onto the semiconductor wafer by spinning at high speed. The spin-on-glass material fills gaps and the uneven topography of the integrated circuit wafer, thereby planarizing it. After spinning onto a substrate, low boiling point solvents are expelled via a low temperature hot plate bake. The wafer is then heated in vacuum or nitrogen to 300°–400° C. This removes higher boiling point solvents and components which can cause cracking and corrosion at subsequent process steps. Very thin coatings are applied this way. If thick coatings are used, the spin-on-glass film cracks due to shrinkage in the baking steps. If a thicker coating is required, multiple coatings must be applied and vacuum baked. This is undesirable because of the time consuming process steps involved and the built up film can still crack in the final cure. The final step in the forming of the spin-on-glass layer is curing at very high temperature. While temperatures as high as 800° to 900° C. may be required to obtain preferable film properties, in integrated circuit fabrication, the maximum temperature at which spin-on-glass film can be cured is often limited to about 450° C. because of the possibility of melting aluminum interconnects or adversely impacting other parts of the integrated circuit.

After a cure at this lower temperature, some spin-on-glass materials contain significant amounts of residual silanols and carbon, and can readily absorb water. The dielectric properties (for example, dielectric constant) of a spin-on-glass film are influenced by the silanol and water content of the film. In the fabrication of integrated circuits it is important to have a low dielectric constant in the spin-on-glass since it becomes the insulating barrier between signal conductors and thus, will determine the upper operating frequency of a circuit. A major disadvantage of thermal methods of curing spin on glass at high temperature is cracking of the spin-on-glass film. Because the spin-on-glass is constrained in a horizontal plane (at the substrate interface), it can only shrink in the vertical direction. This creates great stresses in the spin-on-glass film when it has been baked at very high temperature. These stresses, and the subsequent cracking, have limited spin-on-glass applications despite their favorable attributes: planarization and good gap filling ability. Additionally, the etch rate of thermally cured spin-on-glass is poor compared to the etch rate of thermally grown oxide. It is, therefore, desirable to have some means of curing spin-on-glass at low temperatures to reduce the subsequent cracking of the spin-on-glass while improving its physical properties.

As the importance of low dielectric constant insulating materials has increased as characteristic dimensions of integrated circuits have decreased, organic polymer spin-on dielectric materials have been introduced. These materials also require a curing step at high temperature.

A number of different techniques have been proposed for curing dielectric materials. In U.S. Pat. Nos. 5,192,164 and 5,192,715, Sliwa proposed a technique where an etch back of the spin-on-glass creates unfilled voids between the metal interconnects allowing the spin-on-glass to expand and contract during hard curing without cracking. The drawbacks to this approach are extra process steps and potential of contaminants filing the unfilled voids. Subsequent high temperature baking can trap gases within the voids which can then subsequently cause corrosion of the metal conductors.

An alternative method of curing spin-on-glass is by ion implantation. In U.S. Pat. No. 5,192,697, Leong devised a method of curing spin-on-glass using ion implantation, which allows curing at lower temperatures while improving the oxide etch rate. The high energy ions impinge on the spin-on-glass layer causing, heating and crosslinking. Disadvantages of this technique are that only relatively thin layers can be cured (~1000–2000Å), it requires high vacuum environments (<$2 \times 10^{-5}$ Torr) and expensive equipment. Also, high energy ions can cause damage to the lattice structure of the oxides and radiation damage to the underlying active circuits. Even higher and more damaging implant energies are required to penetrate thicker oxide layers. As shown by Moriya (N. Moriya et al., "Modification Effects in Ion-Implanted $SiO_2$ Spin-in-Glass," J. Electrochem. Soc., Vol 140. No. 5, May 1993. pp. 1442–1450), damage induced by the high energy ions can drastically modify the spin-on-glass (SOG) film properties.

Another technique that has been proposed to cure spin-on-glass is utilizing ultra-violet radiation and a hotplate. In U.S. Pat. No. 4,983,546, Hyun et. al. claim to achieve spin-on-glass properties that are better than thermally cured spin-on-glass cured at 420° C. However. the disclosed process does not produce the superior qualities of the spin-on-glasses that have been cured at 800°–900° C. There are still carbon and silanols present that can cause subsequent cracking and delamination due to water absorption.

Young-Bum Koh el. al. ("Direct Patterning of Spin-on-Glass by Focused Ion Beam Irradiation," Jpn. J. Appl. Phys., Vol 31, (1992) pp. 4479–4482) utilized focused ion beam irradiation to crosslink the spin-on-glass. They compare ion beam irradiation of the spin-on-glass with thermal treatments. Whereas carbon is eliminated in thermal cures of 850° C., high doses of ion beam irradiation show a reduction in the carbon but not elimination. They also report that electron beam irradiation requires 2–3 orders of magnitude higher dose than ion beam irradiation to crosslink the SOG material. This would indicate that electron beam processing of SOG would require long process times.

Crosslinking of siloxane type materials by electron beam irradiation have been reported by numerous workers for direct patterning and use in lithography. Electron beams have been considered for crosslinking of spin-on-glass films. A. Imai and H. Fukuda ("Novel Process for Direct Delineation of Spin on Glass (SOG)," Japanese J. Appl. Physics, Vol. 29, No. 11, 1990, pp. 2653–2656) show a method of crosslinking spin-on-glass using a freely focused electron beam to make the SOG insoluble in a solvent and thereby patterning it directly on a semiconductor substrate. However, Imai and Fuimda only teach the use of an electron beam for patterning the spin-on-glass, not for final curing.

Using high energy electrons to performn final curing of SOG materials is not obvious due to the history of induced damage to semiconductor oxide layers by relatively low dosage exposures of high energy electrons by electron beam lithography tools. Therefore, exposing semiconductor oxides to orders of magnitude higher doses of electrons would seem an anathema to high yield device processing. Moreover, there have been a myriad of deleterious effects found when electron beams expose semiconductor oxides including: charge buildup, production of electronic states at the $Si-SiO_2$ interface, and induced electron traps in oxides. These effects cause the following problems in MOS devices: threshold voltage shifts, channel mobility degradation in transistors, and hot electron effects. Doses utilized in electron beam lithography are in the range of 5 to 100 $\mu C/cm^2$. It would seem that the orders of magnitude higher doses that might be required to fully cure spin-on-glass would cause massive damage to active oxides in semiconductor devices. This may have heretofore discouraged attempts to utilize electron beams for SOG curing.

There is a wealth of prior art showing electron beam damage to semiconductor oxides when irradiated with high doses of electron beam making electron beam irradiation an unobvious choice for curing SOG materials. When high energy electrons are incident on an oxide layer, they generate electron hole pairs. Once generated the pairs can be separated due to a field in the oxide. The electron, being very mobile, transports relatively rapidly to the surface or a conductor layer, whereas the hole may be trapped near the silicon dioxide/silicon interface. This trapping process is referred to as a positive charge build up. Positive charge build up is dependent on temperature. The lower the temperature, the higher the charge build up as the holes are less mobile at lower temperatures. Electronic states at the silicon dioxide/silicon interface cause a subsequent CV curve to be stretched out along the voltage axis instead of an ideal parallel shift. Stretch-out occurs because less silicon bandbending is achieved at a given gate bias when interface states are present.

Interface states can be negatively charged and can affect the threshold voltage in MOS transistors. Electron beam irradiation can cause the creation of neutral electron traps in silicon dioxide films.

Radiation induced neutral electron traps can enhance hot electron instabilities. For MOS transistors with small dimensions, hot electron emission from the silicon substrate into the silicon dioxide layer can occur. A portion of these electrons maybe trapped. This trapped charge causes undesirable effects such as threshold voltage shifts and transconductance degradation.

While drawbacks of electron beam curing of some materials used in semiconductor fabrication have been reported in the prior art, there remains a need for a method for curing spin-on dielectric insulators that avoids the problems of thermal curing. It would be desirable to develop a method of curing that provides comparable or improved properties of dielectric films, as compared with thermally cured films, at lower temperatures and shorter process times.

SUMMARY OF THE INVENTION

The invention disclosed utilizes a large area electron beam to irradiate spin-on-glass or spin-on-polymer dielectric insulating materials in a soft vacuum environment in combination with infra-red lamps to indirectly heat the materials. Electron beam irradiation of spin-on dielectric materials provides dielectric films with similar or improved properties compared with the properties of the same materials that have been thermally cured. For specified electron beam total dose, temperature of the material, and ambient atmosphere, electron beam curing can provide cured material with lower dielectric constants than thermal curing. In addition, electron beam curing results in decreasing the etch rate in a buffered oxide etch solution and in modifying the rate of chemical mechanical polishing of the material as compared with thermal curing. Further, process times for electron beam curing are shorter than process times of typical thermal cure processes.

According to an aspect of the present invention, a method of modifying the properties of a layer of spin-on-glass or spin-on-polymer includes irradiating the layer with a large-area electron beam in a non-oxidizing environment while simultaneously applying heat to the layer until a sufficient electron dose has accumulated to provide a layer with a dielectric constant less than or about equal to the dielectric constant of a thermally cured layer of the same material. A total dose of between 10 and 100,000 microCoulombs per square centimeter ($\mu C/cm^2$) may be used. Preferably, a dose of between 100 and 10,000 $\mu C/cm^2$ is used, and most preferably a dose of between about 2,000 and 5,000 $\mu C/cm^2$ is used. The electron beam is delivered at an energy of between 0.1 and 100 keV, preferably at an energy between 0.5 and 20 keV, and most preferably at an energy between 1 and 10 keV. The electron beam current ranges between 0.1 and 100 mA, more preferably between 1 and 30 mA and most preferably between about 3 and about 20 mA. The entire electron dose may be delivered at a single voltage. Alternatively, the dose is divided into steps of decreasing voltage, which provides a uniform dose process in which the material is cured from the bottom up. During the electron beam curing process, the wafer is kept at a temperature between 10° and 1000° C. Preferably, the wafer temperature is between 30° and 500° C. and most preferably between 200° and 400° C.

According to another aspect of the present invention, a method of fabricating an integrated circuit device is provided. The method includes patterning a metal film on a substrate, depositing a layer of a spin-on glass or spin-on-polymer material on the metal film, irradiating the layer as described above, patterning a via into the irradiating layer, and filling the via with metal. The process may be repeated to produce multiple metal interconnect layers.

BRIEF DESCRIPTION OF THE DRAWINGS

FIG. 3 is a graph of post-cure shrinkage of AlliedSignal Inc. 312B and 512B methylsiloxane films after irradiation at 3,000, 5,000, and 7,000 $\mu C/cm^2$ at processing temperatures of 300 and 400° C.

FIG. 4 is a graph of index of refraction of AlliedSignal Inc. 312B and 512B methylsiloxane films after irradiation at 3,000, 5,000, and 7,000 $\mu C/cm^2$ at processing temperatures of 300 and 400° C. In addition, index of refraction for uncured films, denoted 0 $\mu C/cm^2$ at RT, is plotted.

FIG. 5 is a graph of dielectric constant of AlliedSignal Inc. 312B and 512B methylsiloxane films after irradiation at 3,000, 5,000, and 7,000 $\mu C/cm^2$ at processing temperature of 300° C. The dielectric constant after thermal cure at 400° C. is plotted at the dose labeled as "400."

DESCRIPTION OF THE PREFERRED EMBODIMENTS

Electron beam irradiation is used to cure spin-on glass and spin-on polymer materials that form insulating dielectric layers in semiconductor devices. By adjusting the process conditions, such as electron beam total dose and energy, temperature of the layer, and ambient atmosphere, the properties of the cured dielectric layers can be modified. In particular, it has been found that for certain process conditions, electron beam curing provides films with dielectric constants lower than those of the same material cured by conventional thermal processes. Conventional thermal processes include processes commonly used in semiconductor fabrication such as subjecting spin-on layers to temperatures between about 350 and 500° C. for time periods in excess of about 30 minutes.

Typical spin-on-glass materials include methylsiloxane, methylsilsesquioxane, phenylsiloxane, phenylsilsesquioxane, methylphenylsiloxane, methylphenylsilsesquioxane, and silicate polymers. Spin-on-glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and alkoxyhydridosiloxane or hydroxyhydridosiloxane. Spin-on-glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl.

Organic polymer dielectric materials, often referred to as spin-on polymers, include, polyimides, polytetrafluoroethylene, parylenes, fluorinated and non fluorinated poly(arylene ethers), for example the poly(arylene ether) available under the tradename FLARE™ from Allied-Signal Inc., and the polymeric material obtained from phenyl-ethynylated aromatic monomers and oligomers, provided by Dow Chemical Company under the tradename SiLK™, among other materials.

Figure 1:
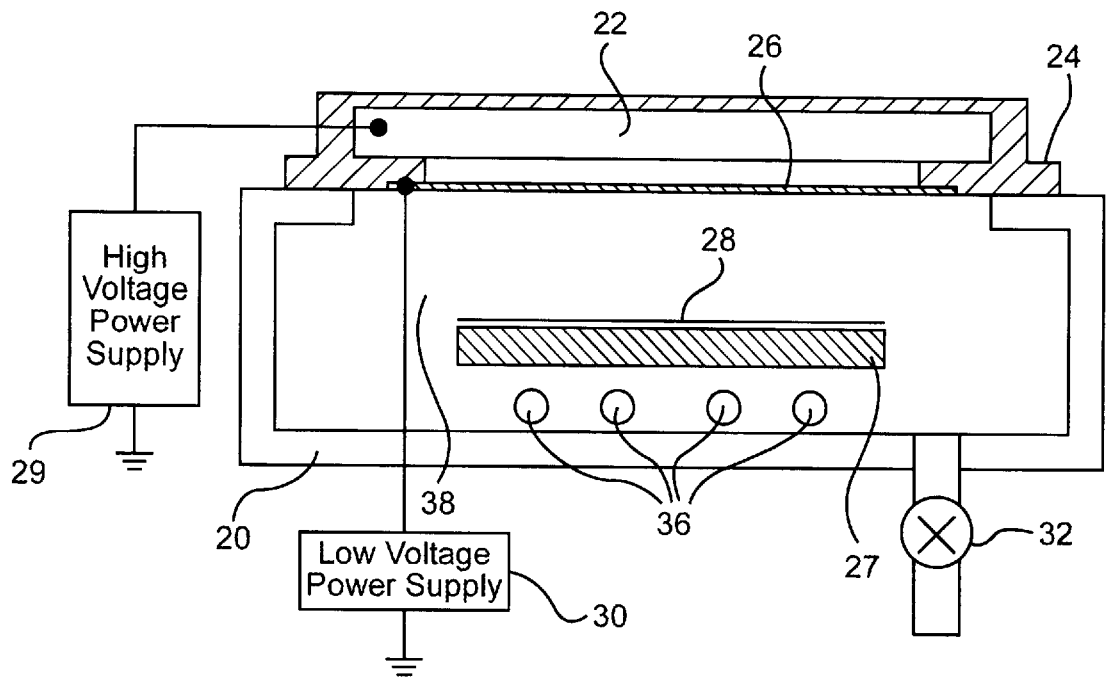
FIGS. 1 and 2 illustrate a cross-sectional view of the process of the invention showing the electron beam exposure apparatus, the substrate being cured and the vacuum chamber.
Figure 2:
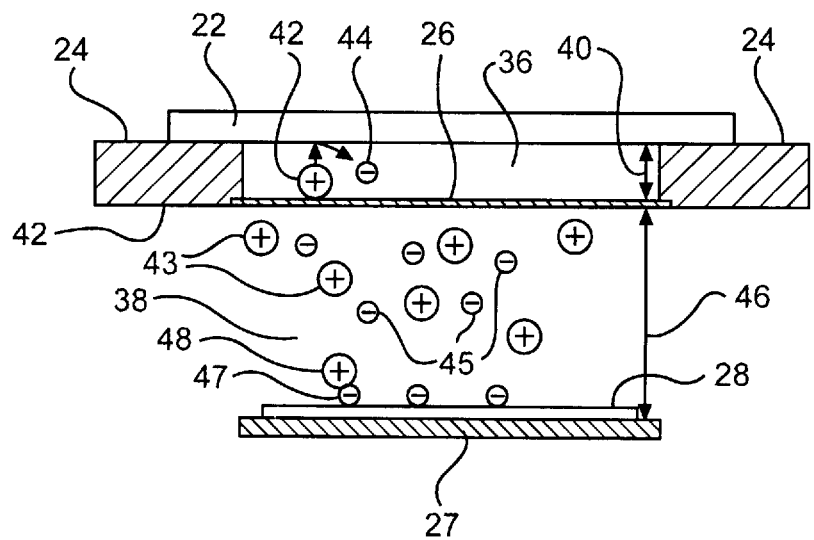

The method of curing spin-on-glass and spin-on polymer materials at low temperature, according to the present invention, is depicted in FIGS. 1 and 2. A substrate 27 is placed in a vacuum chamber 20 at a pressure of 15–40 millitorr and underneath an electron source at a distance from the source sufficient for the electrons to generate ions in their transit between the source and the substrate surface. The electrons can be generated from any type of source that will work within a soft vacuum (15–40 millitorr) environment. A source particularly well suited for this is described in U.S. Pat. No. 5,003,178, the disclosure of which is hereby incorporated into this specification by reference. This is a large uniform and stable source that can operate in a soft vacuum environment. The cathode 22 emits electrons and these are accelerated by the field between the cathode and anode 26. The potential between these two electrodes is generated by the high voltage supply 29 applied to the cathode 22 and the bias voltage supply 30 applied to the anode 26. The electrons irradiate the dielectric layer 28 coated on the substrate 27. Dielectric layer 28 may be any of the spin-on-glass or spin-on-polymer materials described above. A sufficient electron energy is selected to fully penetrate the full thickness of dielectric layer 28. for example, an electron beam energy of 9 keV is used to penetrate a 6000 Å thick film. Quartz lamps irradiate the bottom side of the substrate providing heating independent from the electron beam. A variable leak valve or mass flow controller, identified by reference 32, is utilized to leak in a suitable gas to maintain the soft vacuum environment.

Referring to FIG. 2, electrons 45 traversing the distance 46 between the anode 26 and the substrate 27 ionize the gas molecules located in region 38 generating positive ions. These positive ions 43 are then attracted back to the anode 26 where they can be accelerated, as indicated at 42, toward the cathode to generate more electrons. The dielectric film 28 on the substrate 27 is an insulator and will begin to charge negatively, as indicated at 47, under electron bombardment. However, the positive ions near the substrate surface will be attracted to this negative charge and will then neutralize it. The lamps 36 (see FIG. 1) irradiate and heat the wafer or substrate thereby controlling its temperature. Since the wafer is in a vacuum environment and thermally isolated the wafer can be heated or cooled by radiation. If the lamps are extinguished the wafer will radiate away its heat to the surrounding surfaces and gently cool. In one embodiment of the invention the wafer is simultaneously heated by the infrared lamps and irradiated by the electron beam throughout the entire process.

In the present method, a solution containing a spin-on-glass or spin-on-polymer material is deposited on substrate 27 by conventional means such as spin-coating, or alternatively, spray-coating or dip-coating, to form dielectric layer 28. Integrated circuit devices typically include multiple metal layers and metal interconnect layers. Substrate 27 represents any layer or stack of layers on a multiple-metal layer device. The coated substrate is continuously irradiated with electrons until a sufficient dose has accumulated to cure the material and affect certain film properties such as refractive index, resistance to etchant chemicals, and dielectric constant. A total dose of between 10 and 100,000 micro-Coulombs per square centimeter ($\mu C/cm^2$) may be used. Preferably, a dose of between 100 and 10,000 $\mu C/cm^2$ is used, and most preferably a dose of between about 2,000 and 5,000 µC/cm² is used. The electron beam is delivered at an energy of between 0.1 and 100 keV, preferably at an energy between 0.5 and 20 keV, and most preferably at an energy between 1 and 10 keV. The electron beam current ranges between 0.1 and 100 mA, more preferably between 1 and 30 mA and most preferably between about 3 and about 20 mA. The entire electron dose may be delivered at a single voltage. Alternatively, particularly for films thicker than about 0.25 µm, the dose is divided into steps of decreasing voltage, which provides a "uniform dose" process in which the material is cured from the bottom up. The higher energy electrons penetrate deeper into the film. In this way, the depth of electron beam penetration is varied during the curing process resulting in a uniform energy distribution throughout the film. The variation allows for volatile components, such as solvent residues to leave the film without causing any damage such as pinholes or cracks.

During the electron beam curing process, the wafer is kept at a temperature between 10° and 1000° C. Preferably, the wafer temperature is between 30 and 500° C. and most preferably between 200° and 400° C. The infrared quartz lamps 36 are on continuously until the wafer temperature reaches the desired process temperature. The lamps are turned off and on at varying duty cycle to control the wafer temperature. Typical background process gases in the soft vacuum environment include nitrogen, argon, oxygen, ammonia, forming gas, helium, methane, hydrogen, silane, and mixtures thereof. For many dielectric materials, a non-oxidizing processing atmosphere is used. For other applications, such as complete conversion of siloxane material to silicon dioxide, an oxidizing atmosphere would be appropriate. The optimal choice of electron beam dose, energy, and current, processing temperature, and process gas depends on the composition of the spin-on-glass or spin-on-polymer material.

For a methylsiloxane spin-on-glass material, for example, it has been found that electron beam curing at a total dose of between about 3,000 and about 5,000 µC/cm² at a temperature between about 300° and 400° C. in argon provides a film with a refractive index approximately the same as that of a conventionally thermally cured film. Furthermore, as reported in the data of Example 1, below, the dielectric constant of the film cured at 3,000 µC/cm² and 300° C. was 2.8, and the dielectric constant of the film cured at 5,000 µC/cm² and 300° C. was 2.9, which may be compared with the 3.1 value of the thermally cured film. In addition, it was determined that electron beam curing has beneficial effects, as compared with the results of thermal curing, in decreasing the etch rate in a buffered oxide etch solution and in modifying the rate of chemical mechanical polishing of the material. Further, electron beam curing reduces process times as compared with typical thermal cure processes of one hour at 400 ° C. The process time for a 3,000 µC/cm² total dose at 5 mA is about 10 minutes. Electron beam process time is directly proportional to total dose and inversely proportional to current. In addition, to increasing throughput, shorter process times have the beneficial effect of decreasing the total time an integrated circuit device is exposed to elevated temperature during fabrication. In summary, electron beam curing can provide methylsiloxane films with properties comparable to or better than thermal cured films at shorter process times. It has also been found that at higher doses, for example, a dose of 7,000 µC/cm², electron beam curing modifies methylsiloxane films to a material that is similar to silicon oxide as evidenced by a dielectric constant of about 4 and a higher index of refraction than that obtained at lower doses. Thus, it is possible to modify film properties by adjusting the total dose in electron beam curing processes.

Beneficial results have also been obtained for electron beam curing of poly(arylene ether) spin-on-polymer materials, in particular the poly(arylene ether) material provided by AlliedSignal Inc. under the tradename FLARE™. As reported in Example 2, below, electron beam curing at 3,000 µC/cm² total dose, 300° C., in argon produces a film with refractive index of 1.72 and film shrinkage due to the cure of 6%, the same values as obtained with a thermal cure at 400° C. for one hour. The dielectric constant for the electron beam cured film at 3,000 µC/cm² total dose is 2.5–2.6, as compared with values of 2.9–3.1 for the thermally cured film. Electron beam curing at 5,000 µC/cm² total dose provides a further decrease in dielectric constant to 2.4–2.5. The FTIR spectrum of electron beam cured films is very similar to the FTIR spectrum of a thermally cured film, demonstrating that electron beam irradiation induces similar chemical changes to thermal curing. No evidence of oxidation is observed in either spectrum.

Electron beam curing of spin-on-glass and spin-on-polymer materials is readily integrated into semiconductor fabrication processes. In a typical process, a metal film or layer stack of metal films is deposited on a substrate. The metal film stack is patterned using standard photolithographic and etch process steps. A coating solution containing a spin-on-glass or spin-on-polymer dielectric material is deposited on the patterned stack. The coated stack is processed using a large area electron beam source according to the methods of the present invention. For subtractive aluminum or aluminum damascene processes, the dielectric material may be capped with a silicon dioxide layer for chemical mechanical polishing for global planarization. For copper damascene processing, the dielectric layer may be coated with a hard mask material to act as an etch stop or to protect the dielectric layer during chemical mechanical polishing. As described above, at higher electron beam doses spin-on-glass materials can be modified to have properties similar to silicon oxides. Therefore, electron beam irradiation could be used to modify the top layer of, for example, a methyl siloxane spin-on-glass material to function as a hard mask, obviating the need to deposit a separate layer over the dielectric material.

Returning to the process flow, in subtractive aluminum processing, vias are patterned into the dielectric layer using standard photolithographic and etch processes. The vias are filled with metal to connect metal interconnect levels. In aluminum or copper damascene processing, both vias and trenched are patterned into the dielectric material. The vias and trenches are filled with a barrier layer and then with metal. The metal layer is planarized by chemical mechanical polishing. As many layers as desired are formed above the metal layer by repeating the same sequence of steps.

In contrast to previous reports of electron beam irradiation, it has been observed that the combination of large area electron exposure in a soft vacuum environment reduces the deleterious effects of electron beam irradiation, In electron beam lithography a small tightly focused high current density, beam is deflected over the substrate. The incident beam on the surface of bare oxides in a high vacuum environment builds up charges on the surface creating high fields across the oxide layers.

By way of contrast, in this invention a large area electron source irradiates the entire wafer in a soft vacuum (10–40 millitorr). The electrons traversing from the anode of the electron gun to the substrate, ionize a portion of the gas molecules creating positive ions. Any charge build up on the surface of the substrate is quickly neutralized by the positive ions in the vicinity of the wafer surface. This allows the exposure of spin-on-glass insulating films without any requirement for a conductive coating to drain off charge. Subsurface charge dissipation (within the insulating or silicon dioxide layer) is achieved by electron beam induced conductivity. The entire wafer is exposed simultaneously by high energy electron beam. Therefore the entire irradiated surface is made conductive and able to dissipate the charge injected by the incident electrons to the surface where they are neutralized by positive ions.

Also, we have found that the combination of large area electron beam irradiation and raising the temperature of the spin-on-glass increases the electron beam conductivity of the oxide layers which dissipate charge build up created by the impinging electron beam. This allows the silicon dioxide to be crosslinked and cured without inducing any electron traps or positive charge build-up in the oxide layers. This is a new and novel result. The electron beam induced conductivity effect is dependent on substrate temperature (becoming more conductive with increasing temperature). The method taught in this invention typically utilizes substrate temperatures between 200° and 400° C. This process temperature increases the electron beam induced conductivity effect and therefore accentuates the charge dissipation from the bulk subsurface layers reducing or eliminating the formation of electron/hole traps. In early work on electron beam induced conductivity it was found that a bias field across the oxide layer can trap charges in the oxide layer if the electron beam is removed before the bias field is reduced to zero. This is the case with electron beam lithography where a bias field is created by the surface charge on the oxide in high vacuum. Conversely, it was found that no charges are trapped if the bias is reduced to zero prior to removal of the incident electron beam. Since the surface charge is continually neutralized in the electron exposure apparatus taught with this invention a vanishingly small or zero bias across the oxide is present when the incident electron beam is turned off. This duplicates the conditions described above where no charge traps are generated in the oxide layer.

In electron beam lithography, a finely focused beam writes over small portions of the wafer surface. Although the oxide under the incident beam may be conductive, the adjacent areas are not, creating lateral bias fields across device interfaces. With full wafer exposure by the electron beam as taught by this invention, the entire surface of the wafer and buried oxides are made conductive during irradiation and therefore there are no lateral bias fields to create charge traps upon extinction of the incident beam.

In another embodiment of the invention, the infra-red lamps, are not used to heat the water. The electron beam is used to both irradiate and heat the wafer. By using very high current density electron irradiation to achieve faster processing times, we have found that the electron beam will heat the wafer. If the power in the beam is greater than the wafer can dissipate by radiation (the wafer is thermally isolated from thermally conductive surfaces) the wafer will heat up. In this case the product of the beam current and the beam voltage (power=current x voltage) is greater than the power radiated away by the wafer, and therefore the wafer is heated by the electron beam.

In a further embodiment of the invention, the wafer or substrate can be cooled via a cooled plate. This will keep the wafer or substrate close to ambient temperature and the spin-on-glass film can still be cured with only electron beam irradiation. This process could be used on devices that cannot tolerate even the 200° C. temperature used in the embodiment described above.

EXAMPLE 1

Films of methylsiloxane spin-on-glass material, provided by AlliedSignal Inc. (Morristown, N.J.) under the product names 312B and 512B were prepared by spin coating onto silicon wafers at 3000 rpm for 30 seconds, using a Dia-Nippon Screen spincoater, and baking for one minute each at 80°, 150°, and 250° C. Uniform dose (four-step) electron beam irradiation was performed in an argon atmosphere at 3,000, 5,000, and 7,000 $\mu C/cm^2$, all doses at 5 mA and at 300° C. and 400° C., according to the conditions given below in Table 1. An ElectronCure system available from AlliedSignal Inc. (Morristown, N.J.) was used for the electron beam irradiation.

TABLE 1

Process Conditions for Methylsiloxane Irradiation

| 3000 $\mu C/cm^2$ | | | 5000 $\mu C/cm^2$ | | | 7000 $\mu C/cm^2$ | | |
|---|---|---|---|---|---|---|---|---|
| Step | Dose | Voltage | Step | Dose | Voltage | Step | Dose | Voltage |
| 1 | 1950 | 7.5 | 1 | 3250 | 7.5 | 1 | 4550 | 7.5 |
| 2 | 450 | 3.7 | 2 | 750 | 3.7 | 2 | 1050 | 3.7 |
| 3 | 300 | 3 | 3 | 500 | 3 | 3 | 700 | 3 |
| 4 | 300 | 3 | 4 | 500 | 3 | 4 | 700 | 3 |

Film thickness was measured on a J. A. Woollam M-88 spectroscopic ellipsometer using a 21 point film thickness map. For the 312B material, post-bake, that is pre-cure, thickness was between 2900 Å and 3000 Å; for the 512B material the post-bake thickness was between 4800 Å and 5500 Å. Film shrinkage, reported as the change in thickness after electron beam treatment, is plotted in FIG. 3. Film shrinkage varies between 27 and 31% for electron beam processing at 300° C. and between 28 and 32% for electron beam processing at 400° C. The shrinkage for films that were thermally cured at 400° C. for one hour is about 10%. The index of refraction is shown graphically in FIG. 4., where the value after electron beam processing is compared with the post-bake value of about 1.43. For wafers processed at 300° C. and at doses of 3,000 or 5,000 $\mu C/cm^2$, the index of refraction is very similar to that for thermally cured wafers of 1.51.

Dielectric constant after thermal cure and as a function of electron beam dose at 300° C. is shown in FIG. 5. As discussed above, the dielectric constant decreases from 3.1 after thermal cure to 2.8 at 3,000 $\mu C/cm^2$ and to 2.9 at 5,000 $\mu C/cm^2$. However, after processing at 7,000 $\mu C/cm^2$, a dielectric constant of about 4 is obtained. This observation is consistent with the interpretation that, at the highest dose investigated, the methylsiloxane film has been largely transformed to a silicon oxide-like material.

Wet etch rate of 512B in a 50:1 water/hydrofluoric acid buffered oxide etch solution was measured. The wet etch rate decreases with increasing dose level and processing temperature. At 400° C., the wet etch rate is about 38 nm/min at a dose of 3,000 $\mu C/cm^2$ and about 25 nm/min at a dose of 5,000 $\mu C/cm^2$, which is at least a factor of 10 slower than the typical wet etch rates of thermally cured 512B material.

CMP removal rates were determined on an IPEC 472 CMP tool using Rodel Klebosol 1501-50 slurry. Results for 512B at 300° C. processing temperature are shown as a function of electron beam dose and for thermally cured material in FIG. 6. The removal rate drops from about 650 nm/min for a thermally cured material to about 350 nm/min at the highest dose investigated. As a reference, the CMP removal rate for thermal silicon oxide under these conditions is about 250 nm/min. The CMP results together with the dielectric constant, refractive index, and film shrinkage data support the suggestion above that electron beam curing at 7,000$\mu$C/cm$^2$ transforms the methylsiloxane to a silicon oxide-like material.

EXAMPLE 2

Films of the poly(arylene ether) spin-on-polymer material, provided by AlliedSignal Inc. under the tradename FLARE™, were prepared by spin coating onto silicon wafers at 3000 rpm for 30 seconds, using a Dia-Nippon Screen spincoater, and baking for one minute each at 150°, 200°, and 250° C. Uniform dose (four-step) electron beam irradiation was performed as described in Example 1 according to the conditions given below in Table 2.

TABLE 2

Process Conditions for FLARE ™ Irradiation

| 3000 $\mu$C/cm$^2$ | | | 5000 $\mu$C/cm$^2$ | | | 7000 $\mu$C/cm$^2$ | | |
|---|---|---|---|---|---|---|---|---|
| Step | Dose | Voltage | Step | Dose | Voltage | Step | Dose | Voltage |
| 1 | 1950 | 7.5 | 1 | 3250 | 7.5 | 1 | 4550 | 7.5 |
| 2 | 450 | 3.7 | 2 | 750 | 3.7 | 2 | 1050 | 3.7 |
| 3 | 300 | 3 | 3 | 500 | 3 | 3 | 700 | 3 |
| 4 | 300 | 3 | 4 | 500 | 3 | 4 | 700 | 3 |

Change in thickness due to the electron beam cure, index of refraction, and dielectric constant as a function of electron beam dose and processing temperature are reported in Table 3 below where they are compared with values for a film that was thermally cured at 400° C. for one hour. For the dielectric constant, the range of values obtained from measurements on different wafers is reported.

TABLE 3

Properties of FLARE ™ films after cure

| Dose, Temperature ($\mu$C/cm$^2$, ° C.) | Shrinkage | Index of Refraction | Dielectric Constant |
|---|---|---|---|
| Thermal 400° C. for 1 hr | 6 | 1.72 | 2.89–3.1 |
| 3,000, 300 | 6.1 | 1.72 | 2.48–2.59 |
| 5,000, 300 | 10.9 | 1.78 | 2.49–2.48 |
| 7,000, 300 | 15.2 | 1.84 | 2.41 |
| 3,000, 400 | 12.5 | 1.77 | |
| 5,000, 400 | 20.8 | 1.89 | 2.56 |
| 7,000, 400 | 23.9 | 1.94 | |

Thus, it can be seen that electron beam processing of poly(arylene ether) films provides a dielectric layer with a dielectric constant lower than the dielectric constant of the same material when processed by a conventional thermal cure process.

It will be appreciated from the foregoing that the present invention represents a significant advance in the processing of spin-on-glass and spin-on-polymer materials. Specifically the invention provides a method of curing spin-on-glass and spin-on polymer materials with electron beam irradiation that provides dielectric films with similar or improved properties compared with the properties of the same materials when subjected to thermal curing. In particular, films with dielectric constants lower than the dielectric constants from thermally cured films have been obtained. Furthermore, film properties can be modified by adjusting the electron beam dose. This improved method can be performed more quickly than high temperature thermal curing and at lower temperatures. Further, by irradiating the dielectric films with a large uniform electron beam in a soft vacuum environment, electron beam damage to the sensitive oxides is minimized if not eliminated. It will also be appreciated that, although a number of specific embodiments of the invention have been described in detail for purposes of illustration, various modifications may be made without departing from the spirit and scope of the invention. Accordingly, the invention should not be limited except as by the appended claims.

We claim:

1. A method of modifying a layer of spin-on-glass or spin-on-polymer material, the layer overlying a substrate, the method comprising:
    irradiating the entire layer simultaneously with a large-area electron beam, while the layer is in a non-oxidizing atmosphere, while simultaneously applying heat to the layer until a sufficient electron dose has been accumulated that the layer has a dielectric constant less than or about equal to the dielectric constant of a thermally cured layer of the same material.

2. The method of claim 1 wherein the electron dose is between about 100 $\mu$C/cm$^2$ and about 10,000 $\mu$C/cm$^2$.

3. The method of claim 2 wherein the electron dose is between about 2,000 $\mu$C/cm$^2$ and about 5,000 $\mu$C/cm$^2$.

4. The method of claim 1 wherein the irradiating is at an electron energy between about 0.5 keV and about 20 keV.

5. The method of claim 4 wherein the electron energy is decreased during the irradiation such that a uniform energy distribution is provided throughout the layer.

6. The method of claim 4 wherein the irradiating is at an electron energy between about 1 keV and about 10 keV.

7. The method of claim 1 wherein applying heat to the layer is applying heat to maintain the layer at a temperature of between about 30° C. and about 500° C.

8. The method of claim 7 wherein applying heat to the layer is applying heat to maintain the layer at a temperature of between about 200° C. and about 400° C.

9. The method of claim 3 wherein applying heat to the layer is applying heat to maintain the layer at a temperature of between about 200° C. and about 400° C.

10. The method of claim 1 wherein the spin-on-glass material is selected from the group consisting of methylsiloxane, methylsilsesquioxane, phenylsiloxane, phenylsilsesquioxane, methylphenylsiloxane, methylphenylsilsesquioxane, and silicate polymers.

11. The method of claim 10 further comprising continuing to irradiate the layer until a sufficient electron dose has been accumulated that at least a top portion of the layer has properties similar to the properties of silicon oxide wherein the layer functions as a hardmask layer.

12. The method of claim 1 wherein the spin-on-glass material is selected from the group consisting of hydrogensiloxane, hydrogensilsesquioxane, organohydridosiloxane, and organhydridosilsesquioxane polymers; and copolymers of hydrogensilsesquioxane and an alkoxyhydridosiloxane or hydroxyhydridosiloxane.

13. The method of claim 1 wherein the spin-on-polymer material is selected from the group consisting of polyimides, polytetrafluoroethylene, parylenes, fluorinated and non fluorinated poly(arylene ethers), and the polymeric material obtained from phenyl-ethynylated aromatic monomers and oligomers, and mixtures thereof.

14. The method of claim 1 wherein irradiating the layer is irradiating the layer for a time period less than the time required to thermally cure the layer.

15. A method of modifying a layer of spin-on-glass or spin-on-polymer material, the layer overlying a substrate, the method comprising:

irradiating the entire layer simultaneously with a large-area electron beam, while the layer is in a non-oxidizing atmosphere, while simultaneously applying heat to the layer until a sufficient electron dose has been accumulated that the layer has a rate of etching in a buffered oxide etch that is slower than the rate of etching of a thermally cured layer of the same material.

16. The method of claim 1 wherein the irradiating is conducted in a vacuum of from about 10 millitorr to about 80 millitorr.

* * * * *